(12) United States Patent
Puel

(10) Patent No.: US 12,628,435 B2
(45) Date of Patent: May 12, 2026

---

(54) SELF-REPAIRING MULTI-JUNCTION PHOTOVOLTAIC CELL AND METHOD FOR SELF-REPAIRING SUCH A CELL

(71) Applicant: ELECTRICITE DE FRANCE, Paris (FR)

(72) Inventor: Jean-Baptiste Puel, Paris (FR)

(73) Assignee: ELECTRICITE DE FRANCE, Paris (FR)

( * ) Notice: Subject to any disclaimer, the term of this patent is extended or adjusted under 35 U.S.C. 154(b) by 0 days.

(21) Appl. No.: 18/947,449

(22) Filed: Nov. 14, 2024

(65) Prior Publication Data

US 2025/0169197 A1 May 22, 2025

(30) Foreign Application Priority Data

Nov. 17, 2023 (FR) .................................. FR2312603

(51) Int. Cl.
| | |
|---|---|
| *H10F 10/161* | (2025.01) |
| *H02S 20/30* | (2014.01) |
| *H02S 50/00* | (2014.01) |
| *H10F 19/40* | (2025.01) |

(52) U.S. Cl.
CPC ........... *H10F 10/161* (2025.01); *H02S 20/30* (2014.12); *H02S 50/00* (2013.01); *H10F 19/40* (2025.01)

(58) Field of Classification Search
CPC ........ H10K 85/50; H10K 30/10; H10K 30/57; H10K 39/10; H02S 50/00; H02S 20/30; H10F 19/40; H10F 10/161
See application file for complete search history.

(56) References Cited

U.S. PATENT DOCUMENTS

| | | | |
|---|---|---|---|
| 2015/0053259 A1* | 2/2015 | Hardin ..................... | H10F 77/12 |
| | | | 438/505 |
| 2018/0175112 A1* | 6/2018 | Robinson ............... | H10K 85/50 |
| 2022/0199845 A1* | 6/2022 | Song ..................... | H10F 10/162 |

OTHER PUBLICATIONS

Preliminary Search Report and Written Opinion of the Patentability of the Invention issued on May 16, 2024, in corresponding French Application No. 2312603, 9 pages.
Li, et al., "Perovskite Tandem Solar Cells: From Fundamentals to Commercial Deployment", Chemical Reviews, 2020, vol. 120, No. 19, pp. 9835-9950.
Khan, et al., "Perovskite-based tandem solar cells: Device architecture, stability, and economic perspectives", Renewable and Sustainable Energy Reviews, 2022, vol. 165, Article ID: 112553, pp. 1-21.

* cited by examiner

*Primary Examiner* — Mayla Gonzalez Ramos
(74) *Attorney, Agent, or Firm* — Maier & Maier, PLLC

(57) ABSTRACT

A photovoltaic cell configured to enable the use of first photovoltaic stacks with perovskite absorber in a solar panel as an electrical generator on the sunlight side of the solar panel, while second photovoltaic stacks with perovskite absorber that are on the shadow side of the solar panel undergo a self-repair process during the day. A photovoltaic device includes a solar panel provided with such photovoltaic cells and further includes an electrical connection device adapted to connect electrodes of stacks with perovskite absorber that are on the sunlight side in order to create a multi-junction photovoltaic generator, the connection device being adapted to connect the electrodes of stacks on the shadow side of the solar panel to a regeneration module.

12 Claims, 4 Drawing Sheets

SELF-REPAIRING MULTI-JUNCTION PHOTOVOLTAIC CELL AND METHOD FOR SELF-REPAIRING SUCH A CELL

TECHNICAL FIELD

This disclosure relates to the field of renewable solar energies and concerns a new architecture of multi-junction solar generation units. In the case of thin-film multi-junction solar cells, in particular film layers based on perovskite materials, these layers may undergo reversible degradation and therefore are able to allow self-repair of these layers and therefore of the cells.

BACKGROUND

Silicon solar cells degrade slowly but irreversibly and their average production life cycle is on the order of 40 years (considering a degradation of 0.5% per year and an end of life at 80% of the nominal power). The novel perovskite cell technologies, which will be used in perovskite/silicon multi-junction modules to limit thermalization losses and thus increase efficiency, undergo a more significant degradation according to ongoing studies which varies with the technologies analyzed (on the order of 0.05% to 0.5% per day, for example). However, some of this degradation, linked among other things to the electronic and ionic nature of the charges in perovskite materials, is reversible, which makes it possible to consider a self-repairing of the perovskite layers of multi-junction cells.

The reversible degradation of perovskite layers is linked in particular to the movement of ions within the structure of these layers. Unlike the reference case of silicon, transient phenomena are observed under real conditions, for example in day-night cycles, and one can take advantage of these phenomena to reduce degradation and regain optimal cell performance. Currently, self-repairing in the case of reversible degradation is limited to recovery during night periods, this recovery being similar to resting the cell.

Currently, self-repair, which is limited to the duration of night periods and which in particular is not controlled by an algorithm, may not take into account all of the needs for self-repair created by the cells' use. In addition, the self-repair is not optimized, and in particular does not allow searching for and providing the regeneration optimum required in order to return to the initial performance point of the cells at each cycle/day.

SUMMARY

In view of this situation, the objective of the present disclosure is, on the one hand, to propose cells that allow optimizing their self-repair and to produce photovoltaic modules provided with such cells, and, on the other hand, to provide methods and algorithms for controlling such photovoltaic modules in order to control and maximize the self-repair of said cells. To do so, the invention is based on photovoltaic assemblies configured to allow the use of first photovoltaic stacks as a power generator while a second photovoltaic stack undergoes a self-repair process during the day.

More specifically, this disclosure proposes a photovoltaic cell provided with a photovoltaic assembly comprising, from a first face of the assembly to a second face of the assembly:

a first electrode for connecting a first transparent electrical contact layer to at least a first selective charge extraction layer of a first photovoltaic stack, the first photovoltaic stack, a second electrode for connecting a second transparent electrical contact layer to at least a second selective charge extraction layer of said first photovoltaic stack, a first transparent insulating layer, a third electrode for connecting a first transparent electrical contact layer to at least a second selective charge extraction layer of a second photovoltaic stack, the second photovoltaic stack, a fourth electrode for connecting a second transparent electrical contact layer to at least a first selective charge extraction layer of said second photovoltaic stack, a second transparent insulating layer, a fifth electrode for connecting a first transparent electrical contact layer to at least a first selective charge extraction layer of a third photovoltaic stack, the third photovoltaic stack, a sixth electrode for connecting a second transparent electrical contact layer to at least a second selective charge extraction layer of said third photovoltaic stack, wherein:

the first photovoltaic stack and the third photovoltaic stack are photovoltaic stacks with perovskite absorber, the second photovoltaic stack is a photovoltaic stack in which the absorber material has a lower band gap than that of the first stack and that of the third stack, in particular an absorber material that is silicon, another perovskite, a thin-film absorber, or some other material, said electrodes connecting said transparent electrical contact layers are independent of each other.

Such an assembly makes it possible to produce panel cells in which the perovskite photovoltaic stacks may be isolated from the rest of the assembly in order to be regenerated.

In the assembly, the first and third photovoltaic stacks may each comprise:

one or more first protection and passivation layers for said perovskite absorber, between said first selective charge extraction layers and said perovskite absorber, said perovskite absorber, one or more second protection and passivation layers for said absorbers, between said one or more second selective charge extraction layers and said perovskite absorber.

This disclosure also proposes a photovoltaic device comprising a solar panel provided with photovoltaic assemblies as described above and further comprising an electrical connection device adapted to connect the first electrode and the fifth electrode to the third electrode of said assemblies on the one hand and adapted to connect the second electrode and the sixth electrode to the fourth electrode of said assemblies and create a multi-junction photovoltaic generator, said connection device being adapted to selectively disconnect the electrodes of the first stack of said assemblies or the electrodes of the third stack from the electrodes of the second stack of said assemblies.

When a first face of the panel is arranged on the sunlight side and a second face of the panel is arranged on the shadow side, the electrical connection device is advantageously configured to connect the first photovoltaic stacks and the second photovoltaic stacks in order to form a first current/voltage generator, and to disconnect the third photovoltaic stacks from the first and second photovoltaic stacks in order to place said third photovoltaic stacks in a self-repair mode; and when the second face of the panel is arranged on the sunlight side and the first face of said panel on the shadow side, the electrical connection device is configured to connect the third photovoltaic stacks and the second photovoltaic stacks in order to form a second current/voltage generator, and to disconnect the first photovoltaic stacks from the second and third photovoltaic stacks in order to place the first photovoltaic stacks in a self-repair mode.

This disclosure further proposes a photovoltaic system comprising at least:

a photovoltaic device as described above, a frame provided with turning means for turning the panel, a converter module with MPPT regulation, and a regeneration module for regenerating said perovskite absorbers, wherein the converter module comprises means for monitoring the irradiance detected by the panel and means for monitoring weather data, means for monitoring the degradation of the perovskite absorbers and means for controlling said turning means which are configured to turn said panel over in the event of a degradation exceeding a defined threshold in those among said first or third photovoltaic stacks with perovskite absorber that are positioned on the sunlight side in order to position them on the shadow side and to position the others among said first and third photovoltaic stacks with perovskite absorber on the sunlight side, the connection device being configured to disconnect those among said first and third photovoltaic stacks that are positioned on the shadow side of the converter module and to connect it to the regeneration module.

The regeneration module may comprise at least one of:

a device for short-circuiting the electrodes of a photovoltaic stack with perovskite absorber that is connected to it, a device for open-circuiting the electrodes of said photovoltaic stack with perovskite absorber that is connected to it, a device for generating voltage pulses towards the photovoltaic stack with perovskite absorber that is connected to it, and may comprise means for measuring the current/voltage, in darkness, of said photovoltaic stacks with perovskite absorber that are connected to it.

This disclosure further proposes a method for controlling solar panels comprising photovoltaic assemblies in a system as described above:

one or more measurements of the detected irradiance and the temperature at said at least one panel, and measurements of weather data;

a detection of whether it is a day or night situation;

if night is detected:

one or more recordings and analyses of the regeneration of the first and third photovoltaic stacks with perovskite absorber, estimation of the time required for maximum regeneration of said stacks, and implementation of regeneration processes for said first and third photovoltaic stacks with perovskite absorber of said panel;

if day is detected:

one or more sequences comprising: regeneration of the shadow-side photovoltaic stacks with perovskite absorber; estimation of the expected performances of the sunlight-side photovoltaic stacks with perovskite absorber; measurement of the degradation of the sunlight-side photovoltaic stacks with perovskite absorber relative to said expected performances; and estimation of the regeneration rate of the shadow-side photovoltaic stacks with perovskite absorber of said panel relative to said expected performances in order to detect a regeneration rate giving a higher performance of the shadow-side photovoltaic stacks with absorber than the performance of the sunlight-side photovoltaic stacks with perovskite absorber after degradation; and a detection such that:

if the regeneration of the shadow-side photovoltaic stacks with perovskite absorber corresponds to a higher performance than the performance of the sunlight-side photovoltaic stacks with perovskite absorber after degradation, said panel is turned over by controlling said turning means;

if the regeneration of the shadow-side photovoltaic stacks with perovskite absorber remains lower than the performance of the degraded sunlight-side photovoltaic stacks with perovskite absorber, the panel is maintained in its position.

This disclosure also concerns a method for controlling panels wherein the estimation of the regeneration rate of the shadow-side photovoltaic stacks with perovskite absorber of said panel comprises current/voltage measurements in shadow.

The regeneration steps may comprise at least one of the following operations:

one or more applications of voltage pulses across the photovoltaic stacks with perovskite absorber, short-circuiting said photovoltaic stacks with perovskite absorber, one or more times, and open-circuiting said photovoltaic stacks with perovskite absorber, one or more times.

Said sequence may be repeated throughout the operation of said panels.

This disclosure additionally proposes a photovoltaic system comprising a processor associated with a program memory containing a program provided with instructions for implementing said method.

This disclosure provides a computer-readable non-transitory storage medium on which said program is stored.

BRIEF DESCRIPTION OF DRAWINGS

Other features, details and advantages of the invention will become apparent upon reading the detailed description below of some non-limiting exemplary embodiments, and upon analyzing the appended drawings, in which.

DETAILED DESCRIPTION

The drawings and the following description contain elements which may not only serve to provide a better understanding of the invention, but where appropriate may also contribute to its definition.

Figure 1:
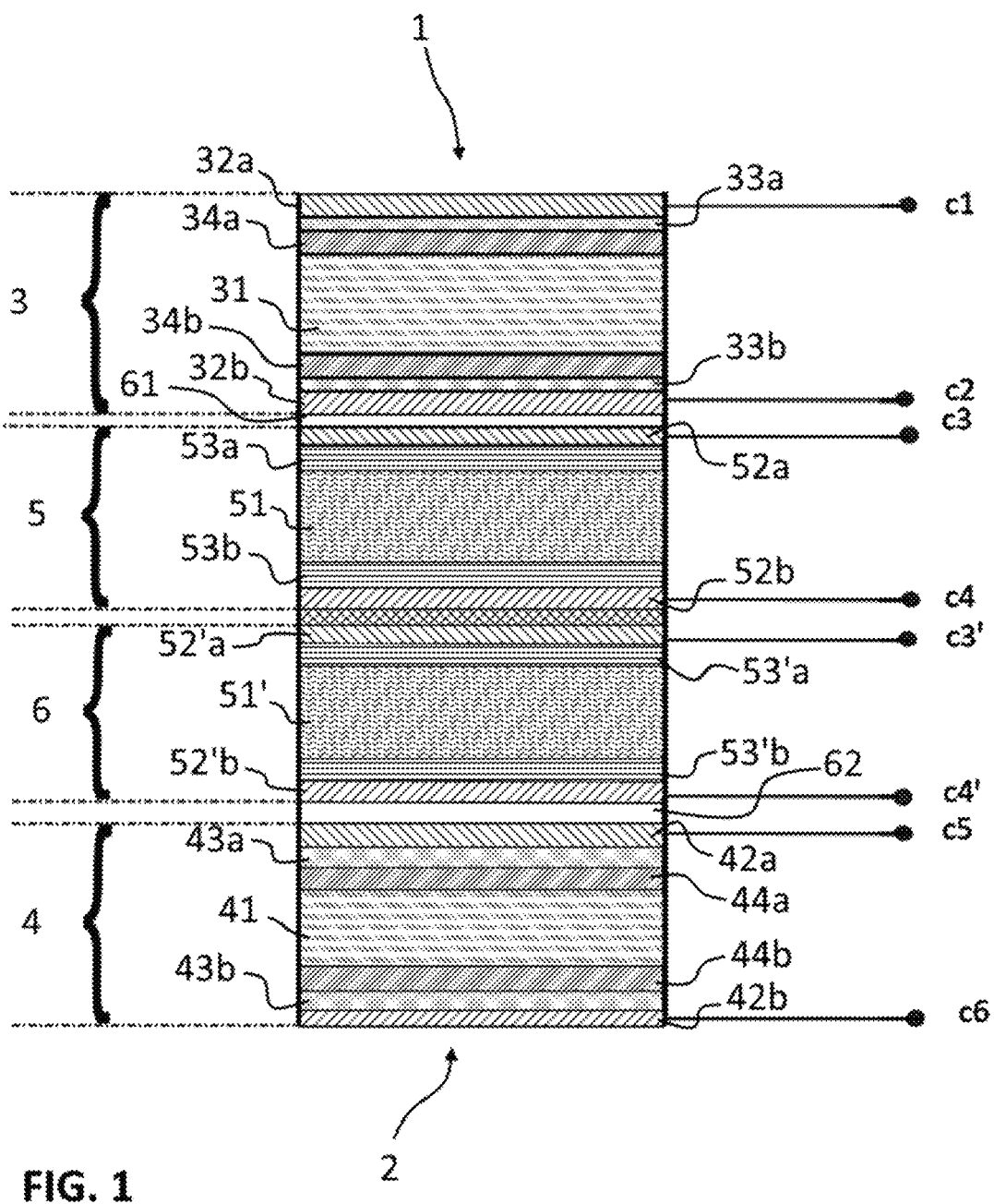
FIG. 1 shows a schematic cross-section view of a photovoltaic assembly.

Reference is now made to FIG. 1 which shows a first embodiment of a photovoltaic assembly of this disclosure which comprises, from a first face 1 of the assembly to a second face 2 of the assembly:

a first electrode c1 which is connected to a first transparent electrical contact layer 32a, for example a contact grid or a conductive layer, in order to connect at least a first transparent charge extraction layer 33a of a first photovoltaic stack 3, first photovoltaic stack 3, a second electrode c2 which is connected to a second transparent electrical contact layer 32b, for example a contact grid or a conductive layer, in order to connect at least a second transparent charge extraction layer 33b of first photovoltaic stack 3, a first transparent insulating layer 61, a third electrode c3 connected to a first transparent electrical contact layer 52a in order to connect at least a first transparent charge extraction layer 53a of a second photovoltaic stack, second photovoltaic stack 5, a fourth electrode c4 connected to a second transparent electrical contact layer 52b in order to connect at least a second transparent charge extraction layer 53b of second photovoltaic stack 5, a second transparent insulating layer 62, a fifth electrode c5 which is connected to a first transparent electrical contact layer 42a in order to connect at least a first transparent charge extraction layer 43a of a third photovoltaic stack 4, third photovoltaic stack 4, a sixth electrode c6 which is connected to a second transparent electrical contact layer 42b in order to connect at least a second transparent charge extraction layer 43b of said third photovoltaic stack, wherein:

first photovoltaic stack 3 and third photovoltaic stack 4 are photovoltaic stacks with perovskite absorber 31, 41, second photovoltaic stack 5 is a photovoltaic stack with a silicon absorber 51, an absorber composed of another perovskite, a thin-film absorber, or an absorber of a material having a lower band gap than that of the first stack and that of the third stack, electrodes c1, c2, c3, c4, c5, c6 for connecting extraction layers 33a, 33b, 43a, 43b, 53a, 53b through conductive layers 32a, 32b, 42a, 42b, 52a, 52b are independent of each other.

Figures 2A, 2B:
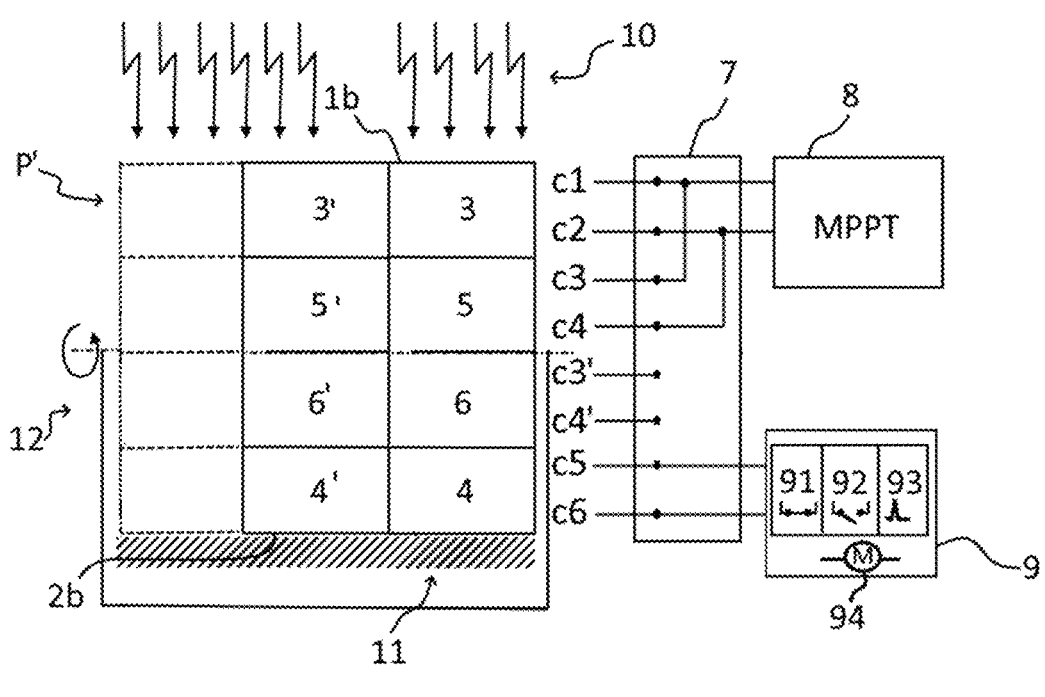
FIG. 2A, shows a schematic view of a use of the assembly of FIG. 1.
FIG. 2B, shows a schematic view of a use of the assembly of FIG. 1.

This embodiment produces a photovoltaic cell which offers the possibility of being bifacial depending on the chosen contact connections, and in which the stacks have separate output electrodes, making it possible to isolate photovoltaic stack 4 on the shadow side 11 from stack 3 on the sunlight side 10 and central stack 5, as in FIG. 2A, or to isolate photovoltaic stack 3 on the shadow side 11 from stack 4 on the sunlight side 10 and center stack 5, as in FIG. 2B, when the panel comprising the cells of this disclosure is turned over.

Referring again to FIG. 1, the first and third photovoltaic stack each comprise one or more first protection and passivation layers 34a, 44a, 33b, 44b for said absorbers, between the selective charge extraction layers 33a, 43a, 33b, 43b on each side of perovskite absorber 31, 41.

The selective charge extraction layers may in particular be layers known by the abbreviations ETL or HTL ("electron transport layer" or "hole transport layer").

The electrically insulating and optically transparent layers 61, 62 are for example films known in the field by the acronym EVA.

The assemblies shown are component elements of solar panels P, schematically represented for the first embodiment in FIG. 2A in a first position and in FIG. 2B in a position that is turned over relative to the first position as seen above. In the figures, two panel assemblies are shown in order to avoid complicating the drawing, but the panel may comprise a large number of assemblies in an x, y matrix. The assemblies are chosen according to the desired voltage and current to be output from the device, according to the electrical system downstream. In the context of this disclosure, the electrodes of first stacks 3, 3', . . . are connected in parallel, the electrodes of second stacks 5, 5', . . . are connected in parallel, and the electrodes of third stacks 4, 4', . . . are connected in parallel.

For this configuration, the stacks with perovskite absorber located on the light side 10 and the stacks with silicon absorber are receiving light and can operate as a generator, while the stacks with perovskite absorber located under the panel and which receive practically no light may be placed in a regeneration configuration even during the day.

To do so, a connection device 7 is configured to allow the electrodes of the photovoltaic stacks with perovskite absorber that are under the panel to be disconnected from the electrodes of the other stacks which are connected in parallel. This makes it possible to connect the electrodes of the stacks with perovskite absorber that are under the panel to a regeneration module 9, while the electrodes of the light-side stacks 10 with perovskite absorbers and the stacks with silicon absorbers are connected to an MPPT converter module 8, MPPT being the acronym for "Maximum power point tracking".

In the case of FIG. 2A, it is the electrodes of photovoltaic stacks 4, 4' which are located under the panel in the shadow 11 of the panel when face 1a of the panel is on the light side and face 2a of the panel is on the shadow side. These stacks with perovskite absorbers are then connected to the regeneration module through electrical connection device 7. In this case, stacks with perovskite absorber 3, 3' on the light side 11 and stacks with silicon absorber 5, 5' are connected together and linked to MPPT converter module 8 through electrical connection device 7.

In the case of FIG. 2B, the panel has been turned over and it is the electrodes of photovoltaic stacks 3, 3' that are located under the panel in the shadow 11 of the panel when face 2a of the panel is on the light side and face 1a of the panel is on the shadow side. These stacks are then connected to the regeneration module through electrical connection device 7. In this case, it is stacks with perovskite absorbers 4, 4' that are on the light side 11, and it is silicon stacks 5, 5' that are connected together and linked to MPPT converter module 8 through electrical connection device 7.

To do this, the electrical connection device may comprise two contact carrier plates adapted to rotate relative to each other as occurs in a rotary connector, or may be an electronic device with electronic switches, for example based on IGBT (insulated gate bipolar transistor) or MOSFET (metal-oxide gate field effect transistor) transistors which are configured to distribute the electrodes between MPPT converter module 8 and regeneration module 9 and are controlled by the position of the panel.

This system therefore allows performing sequences of self-repair or regeneration of the stacks with perovskite absorbers which are located under the panel during the day, while the panel is supplying electricity by means of the multi-junction cells formed by the light-side stacks with perovskite absorber on the upper face and the central stacks for example with silicon absorber of the panels.

To allow panels P, P' to operate as explained above, the panels are integrated into a photovoltaic system comprising: said panels mounted in frames equipped with turning means 12 for turning the panels; electrical connection devices 7 associated with the panels, preferably one per panel or one per group of assemblies in a distribution of assemblies by row or by column on the panel; one or more converter modules 8 with MPPT regulation; and one or more regeneration modules 9 for regenerating said perovskite absorbers.

The converter module(s) are connected to the panel outputs in a selective manner so that only the active stacks are connected. These converter modules preferably comprise means for monitoring the irradiance detected by the panel and means for monitoring weather data.

According to this disclosure, the converter modules or the monitoring modules associated with them are provided with means for monitoring the degradation of perovskite absorbers 31, 41.

They comprise means for controlling said turning means 12 which are configured to turn over the panels associated therewith in the event of a degradation exceeding a defined threshold of the ones among said photovoltaic stacks 3, 4 with perovskite absorbers of the panel that are positioned on the sunlight side 10 in order to position them on the shadow side and position on the sunlight side the photovoltaic stacks 4, 3 with perovskite absorbers of the panel that were previously on the shadow side.

In parallel, when turning panels over, connection device 7 of the panels is configured to disconnect those among said first and third photovoltaic stacks that are positioned on the shadow side of converter module 8 and to connect them to regeneration modules 9 associated with the rotated panels.

For the regeneration of perovskite absorbers that is related to the movement of ions and their distribution, the regeneration modules comprise at least one among:

a device 91 for short-circuiting the electrodes of a photovoltaic stack with perovskite absorber that is connected to it, a device 92 for open-circuiting the electrodes of said photovoltaic stack with perovskite absorber that is connected to it, a device 93 for generating voltage pulses towards the photovoltaic stack with perovskite absorber that is connected to it.

To measure the degradation and regeneration of the stacks, regeneration module 9 comprises means 94 for measuring the current/voltage of said photovoltaic stacks with perovskite absorber, in darkness.

These devices are used based on the degradation of said stacks in order to reposition the ions according to determined sequences comprising for example regeneration modes comprising in particular a short-circuiting of the stacks, an open-circuiting of the stacks, and/or a generation of voltage pulses across the stacks, the system being configured to evaluate autonomously whether the treatment is effective or whether to switch to another mode.

Figure 4:
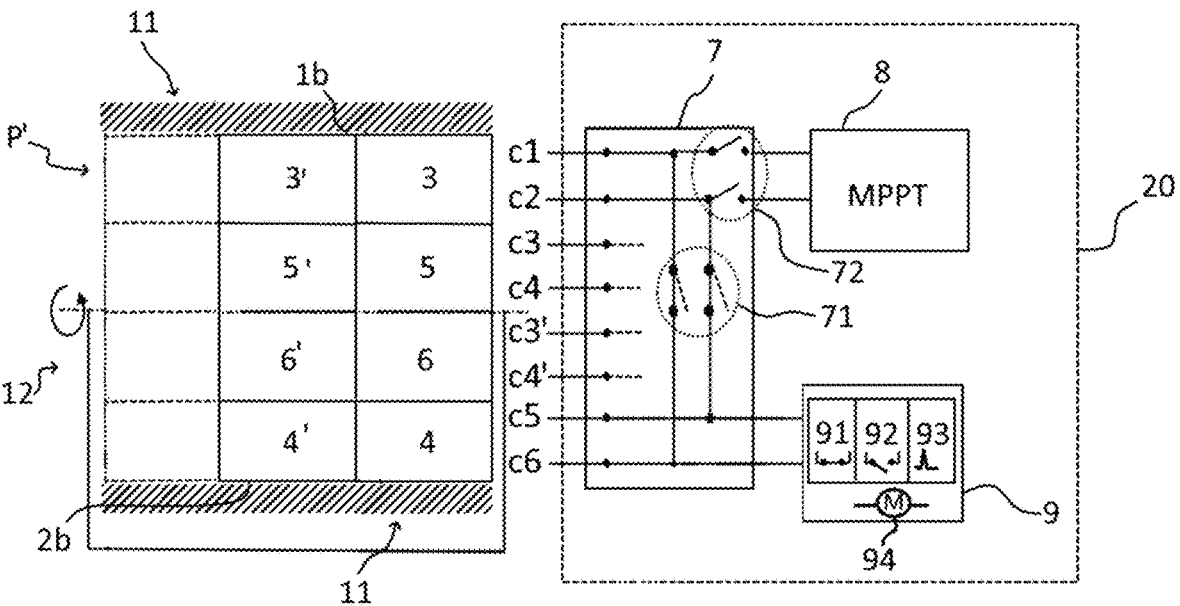
FIG. 4 shows a schematic view of a use of a panel of the present disclosure at night.

It should be noted that, during the day, the stacks located under the panels are regenerated, while at night the stacks with perovskite absorbers on both sides of the panel are regenerated. To do this, the connection device may, as shown in FIG. 4, comprise two groups of additional switches 71, 72 controlled by the converter module and by the means for day/night detection for example coming from means for monitoring the weather, these groups of additional switches 71, 72 making it possible to connect all the stacks with perovskite absorber to regeneration device 9 and to disconnect them from converter module 8.

Figure 3:
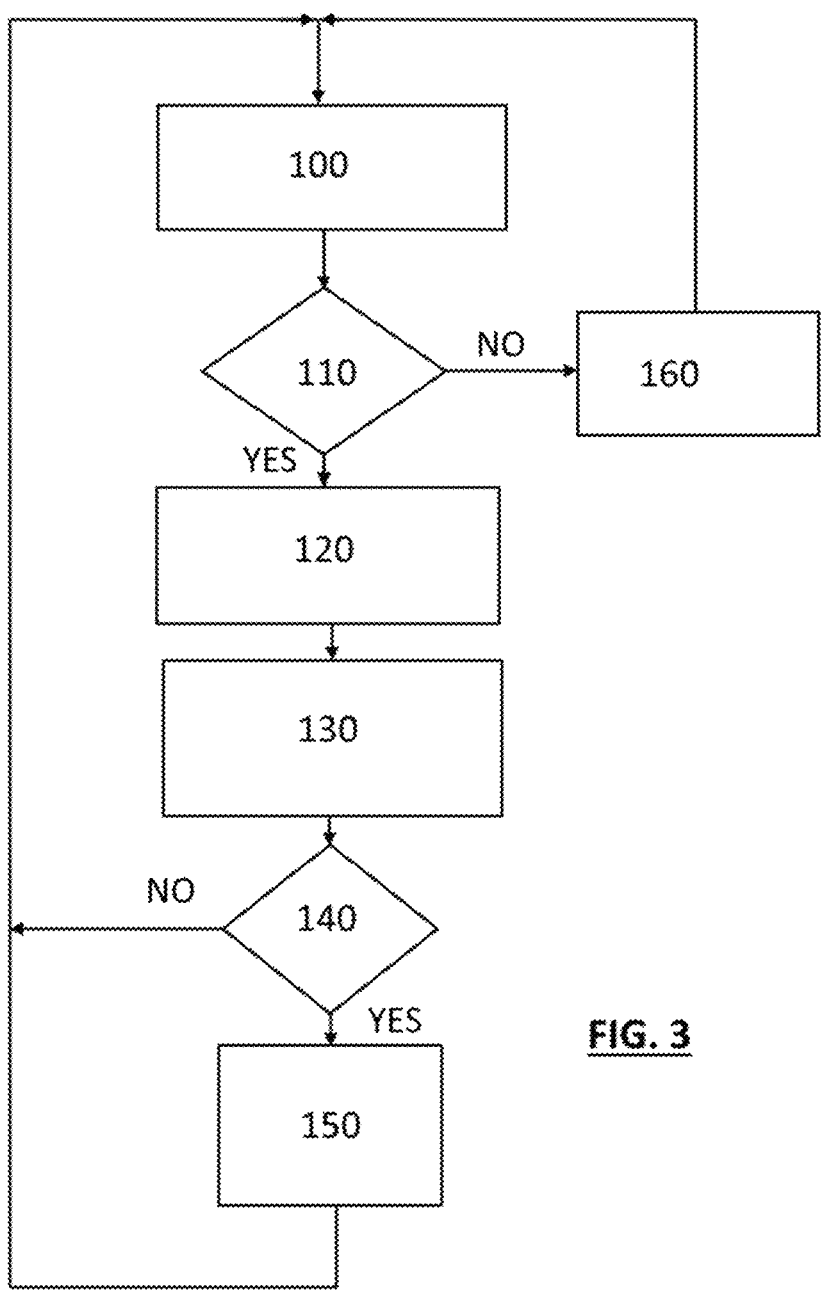
FIG. 3 shows an example of a flowchart of a method for controlling a solar panel.

A method for controlling a photovoltaic system as described in FIG. 3 may in particular comprise a sequence of:

one or more measurements of the detected irradiance and the temperature at said at least one panel, and measurements of weather data;

a detection 110 of whether it is a day or night situation;

if night is detected:

one or more recordings and analyses of the regeneration of the first and third photovoltaic stacks with perovskite absorber, estimation of the time required for maximum regeneration of said stacks, and implementation of regeneration processes for said photovoltaic stacks with perovskite absorber of panel 160;

if day is detected:

one or more sequences comprising: regeneration 120 of the shadow-side photovoltaic stacks with perovskite absorber; estimation of the expected performances of the sunlight-side photovoltaic stacks with perovskite absorber; measurement of the degradation of the sunlight-side photovoltaic stacks with perovskite absorber relative to said expected performances; and estimation of the regeneration rate of the shadow-side photovoltaic stacks with perovskite absorber of said panel relative to said expected performances in order to detect a regeneration rate giving a higher performance of the shadow-side stacks with absorber photovoltaic than the performance of the sunlight-side photovoltaic stacks with perovskite absorber after degradation 130; and a detection 140 such that, if the regeneration of the shadow-side photovoltaic stacks with perovskite absorber corresponds to a higher performance than the performance of the sunlight-side photovoltaic stacks with perovskite absorber after degradation, said panel is turned over 150 by controlling turning means 12;

if the regeneration of the shadow-side photovoltaic stacks with perovskite absorber remains lower than the performance of the degraded sunlight-side photovoltaic stacks with perovskite absorber, the panel is maintained in its position.

Estimation of the regeneration rate of shadow-side photovoltaic stacks with perovskite absorber of said panel comprises current/voltage measurements in shadow.

The regeneration steps comprise at least one of the following operations:

one or more applications of voltage pulses across the photovoltaic stacks with perovskite absorber, short-circuiting said photovoltaic stacks with perovskite absorber, one or more times, and open-circuiting said photovoltaic stacks with perovskite absorber, one or more times.

Said sequence is in particular repeated throughout the operation of said panels and the life of the system.

The invention is not limited to the examples described above solely as examples, but encompasses all variants conceivable to a person skilled in the art in the context of the protection sought. In particular, the converter module, connection device, and regeneration module may be separate elements or may be grouped wholly or in part in a controller device, and the method may be integrated into a method for managing a fleet of solar panels or groups of panels.

What is claimed is:

1. A multi-junction photovoltaic cell comprising a photovoltaic assembly, wherein from a first face of the assembly to a second face of the assembly the multi-junction solar cell comprises:

a first photovoltaic stack comprising a first transparent electrical contact layer, at least a first selective charge extraction layer, at least a second selective charge extraction layer and a second transparent electrical contact layer, a first electrode for connecting the first transparent electrical contact layer to the at least a first selective charge extraction layer of the first photovoltaic stack, a second electrode for connecting the second transparent electrical contact layer to the at least second selective charge extraction layer of said first photovoltaic stack, a first transparent insulating layer, a second photovoltaic stack comprising a first transparent electrical contact layer, at least a first selective charge extraction layer, at least a second selective charge extraction layer and a second transparent electrical contact layer, a third electrode for connecting the first transparent electrical contact layer to the at least second selective charge extraction layer of the second photovoltaic stack, a fourth electrode for connecting the second transparent electrical contact layer to the at least first selective charge extraction layer of said second photovoltaic stack, a second transparent insulating layer, a third photovoltaic stack comprising a first transparent electrical contact layer, at least a first selective charge extraction layer, at least a second selective charge extraction layer and a second transparent electrical contact layer, a fifth electrode for connecting the first transparent electrical contact layer to the at least first selective charge extraction layer of the third photovoltaic stack, a sixth electrode for connecting the second transparent electrical contact layer to the at least second selective charge extraction layer of said third photovoltaic stack, wherein the first photovoltaic stack and the third photovoltaic stack are photovoltaic stacks comprising a perovskite absorber, the second photovoltaic stack is a photovoltaic stack in which the absorber material has a lower band gap than that of the first stack and that of the third stack, and wherein said electrodes connecting said transparent electrical contact layers are independent of each other.

2. The multi-junction photovoltaic cell according to claim 1, wherein the first and third photovoltaic stack each comprises:

one or more first protection and passivation layers for said absorbers, between said first selective charge extraction layers and said perovskite absorber, one or more second protection and passivation layers for said absorbers, between said one or more second selective charge extraction layers and said perovskite absorber.

3. A photovoltaic device comprising a solar panel provided with a plurality of multi-junction photovoltaic cells according to claim 1, and further comprising an electrical connection device adapted to connect the first electrode and the fifth electrode to the third electrode of said assemblies, and adapted to connect the second electrode and the sixth electrode to the fourth electrode of said assemblies and create a multi-junction photovoltaic generator, said connection device being adapted to selectively disconnect the electrodes of the first stack of said assemblies or the electrodes of the third stack from the electrodes of the second stack of said assemblies.

4. The photovoltaic device according to claim 3, wherein, when a first face of the panel is arranged on the sunlight side and a second face of the panel is arranged on the shadow side, the electrical connection device is configured to connect the first photovoltaic stacks and the second photovoltaic stacks in order to form a first current/voltage generator, and to disconnect the third photovoltaic stacks from the first and second photovoltaic stacks in order to place said third photovoltaic stacks in a self-repair mode; and wherein, when the second face of the panel is arranged on the sunlight side and the first face of said panel on the shadow side, the electrical connection device is configured to connect the third photovoltaic stacks and the second photovoltaic stacks in order to form a second current/voltage generator, and to disconnect the first photovoltaic stacks from the second and third photovoltaic stacks in order to place the first photovoltaic stacks in a self-repair mode.

5. A photovoltaic system comprising at least:

a photovoltaic device according to claim 3, a frame provided with turning means for turning the panel, a converter module with MPPT regulation, and a regeneration module for regenerating said perovskite absorbers, wherein the converter module comprises means for monitoring the irradiance detected by the panel and means for monitoring weather data, means for monitoring the degradation of the perovskite absorbers and means for controlling said turning means which are configured to turn said panel over in the event of a degradation exceeding a defined threshold in those among said first or third photovoltaic stacks with perovskite absorber that are positioned on the sunlight side in order to position them on the shadow side and to position the others among said first and third photovoltaic stacks with perovskite absorber on the sunlight side, the connection device being configured to disconnect those among said first and third photovoltaic stacks that are positioned on the shadow side of the converter module and to connect it to the regeneration module.

6. The photovoltaic system according to claim 5, wherein the regeneration module comprises at least one of:

a device for short-circuiting the electrodes of a photovoltaic stack with perovskite absorber that is connected to it, a device for open-circuiting the electrodes of said photovoltaic stack with perovskite absorber that is connected to it, a device for generating voltage pulses towards the photovoltaic stack with perovskite absorber that is connected to it, and comprises means for measuring the current/voltage, in darkness, of said photovoltaic stacks with perovskite absorber that are connected to it.

7. A method for controlling a photovoltaic device of claim 3, comprising a sequence of:

one or more measurements of the detected irradiance and the temperature at said at least one panel, and measurements of weather data;

a detection of whether it is a day or night situation;

a. when night is detected:

i. one or more recordings and analyses of the regeneration of the first and third photovoltaic stacks with perovskite absorber, estimation of the time required for maximum regeneration of said stacks, and implementation of regeneration processes for said first and third photovoltaic stacks with perovskite absorber of said panel;

b. when day is detected:

i. one or more sequences comprising: regeneration of the shadow-side photovoltaic stacks with perovskite absorber; estimation of the expected performances of the sunlight-side absorber photovoltaic stacks with perovskite absorber; measurement of the degradation of the sunlight-side photovoltaic stacks with perovskite absorber relative to said expected performances; and estimation of the regeneration rate of the shadow-side photovoltaic stacks with perovskite absorber of said panel relative to said expected performances in order to detect a regeneration rate giving a higher performance of the shadow-side photovoltaic stacks with absorber than the performance of the sunlight-side photovoltaic stacks with perovskite absorber after degradation; and a detection such that:

ii. when the regeneration of the shadow-side photovoltaic stacks with perovskite absorber corresponds to a higher performance than the performance of the sunlight-side photovoltaic stacks with perovskite absorber after degradation, said panel is turned over;

iii. when the regeneration of the shadow-side photovoltaic stacks with perovskite absorber remains lower than the performance of the degraded sunlight-side photovoltaic stacks with perovskite absorber, the panel is maintained in its position.

8. The method for controlling panels according to claim 7, wherein the estimation of the regeneration rate of the shadow-side photovoltaic stacks with perovskite absorber of said panel comprises current/voltage measurements in shadow/in darkness.

9. The method for controlling panels according to claim 7, wherein the regeneration steps comprise at least one of the following operations:

one or more applications of voltage pulses across the photovoltaic stacks with perovskite absorber, short-circuiting said photovoltaic stacks with perovskite absorber, one or more times, and open-circuiting said photovoltaic stacks with perovskite absorber, one or more times.

10. The method for controlling panels according to claim 7, wherein said sequence is repeated throughout the operation of said panels.

11. The photovoltaic system according to claim 5, comprising a processor associated with a program memory containing a program provided with instructions configured to perform the following steps:

a sequence of:

one or more measurements of the detected irradiance and the temperature at said at least one panel, and measurements of weather data; and a detection of whether it is a day or night situation;

a. when night is detected:

i. one or more recordings and analyses of the regeneration of the first and third photovoltaic stacks with perovskite absorber, estimation of the time required for maximum regeneration of said stacks, and implementation of regeneration processes for said first and third photovoltaic stacks with perovskite absorber of said panel;

b. when day is detected:

i. one or more sequences comprising: regeneration of the shadow-side photovoltaic stacks with perovskite absorber; estimation of the expected performances of the sunlight-side absorber photovoltaic stacks with perovskite absorber; measurement of the degradation of the sunlight-side photovoltaic stacks with perovskite absorber relative to said expected performances; and estimation of the regeneration rate of the shadow-side photovoltaic stacks with perovskite absorber of said panel relative to said expected performances in order to detect a regeneration rate giving a higher performance of the shadow-side photovoltaic stacks with absorber than the performance of the sunlight-side photovoltaic stacks with perovskite absorber after degradation; and a detection such that:

ii. when the regeneration of the shadow-side photovoltaic stacks with perovskite absorber corresponds to a higher performance than the performance of the sunlight-side photovoltaic stacks with perovskite absorber after degradation, said panel is turned over by controlling said turning means;

iii. when the regeneration of the shadow-side photovoltaic stacks with perovskite absorber remains lower than the performance of the degraded sunlight-side photovoltaic stacks with perovskite absorber, the panel is maintained in its position.

12. A computer-readable non-transitory storage medium on which the program of claim 11 is stored.

\* \* \* \* \*